(12) United States Patent  
Schrödinger (10) Patent No.: US 8,031,992 B2  
(45) Date of Patent: Oct. 4, 2011

(54) OPTOELECTRONIC MODULE AND METHOD FOR PRODUCING AN OPTOELECTRONIC MODULE

(75) Inventor: Karl Schrödinger, Berlin (DE)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/841,786

(22) Filed: May 7, 2004

(65) Prior Publication Data

US 2005/0249450 A1 Nov. 10, 2005

(51) Int. Cl.  
*G02B 6/42* (2006.01)

(52) U.S. Cl. .......................................... 385/31

(58) Field of Classification Search .................. None  
See application file for complete search history.

(56) References Cited

U.S. PATENT DOCUMENTS

| | | | |
|---|---|---|---|
| 5,259,054 A * | 11/1993 | Benzoni et al. ................. | 385/89 |
| 6,014,476 A | 1/2000 | Meyer-Güldner et al. | |
| 6,315,463 B1 * | 11/2001 | Kropp ............................. | 385/88 |
| 6,713,852 B2 * | 3/2004 | Abbott et al. ................. | 257/677 |
| 6,897,485 B2 * | 5/2005 | Kropp .............................. | 257/80 |
| 2002/0018626 A1 * | 2/2002 | Muller et al. .................. | 385/88 |
| 2003/0139503 A1 * | 7/2003 | Dobler et al. ................. | 524/165 |
| 2003/0161371 A1 | 8/2003 | Althaus et al. | |
| 2004/0200573 A1 * | 10/2004 | Dudoff et al. ............. | 156/345.1 |
| 2004/0213523 A1 * | 10/2004 | Trezza et al. .................. | 385/59 |
| 2005/0001221 A1 * | 1/2005 | Killer .............................. | 257/80 |

FOREIGN PATENT DOCUMENTS

| | | |
|---|---|---|
| DE | 199 35 496 C1 | 1/2001 |
| DE | 102 01 102 A1 | 7/2003 |
| EP | 1 068 022 A2 | 1/2002 |

* cited by examiner

*Primary Examiner* — Timothy L Rude  
(74) *Attorney, Agent, or Firm* — Maschoff Gilmore & Israelsen (57) ABSTRACT

The invention relates to an optoelectronic module having at least one leadframe, at least one carrier element connected to the leadframe, and at least one optoelectronic component connected to the carrier element, which component can emit and/or receive light. The invention furthermore relates to a method for producing an optoelectronic module that includes providing at least one leadframe, at least one carrier element and at least one optoelectronic component, connecting the optoelectronic component to the carrier element and connecting the carrier element to the leadframe, and at least partly encapsulating the optoelectronic component, the carrier element and the leadframe with a plastic.

33 Claims, 6 Drawing Sheets

OPTOELECTRONIC MODULE AND METHOD FOR PRODUCING AN OPTOELECTRONIC MODULE

FIELD OF THE INVENTION

The invention relates to an optoelectronic module and to a method for producing an optoelectronic module.

BACKGROUND OF THE INVENTION

Optoelectronic components are becoming more and more important with regard to the rising requirements made of fast and reliable optical data transmission paths. In order to be able to efficiently fit the individual optoelectronic components into printed circuit board environments or printed circuit board layouts, they have to be processed to form corresponding modules or be incorporated into housings which have good radio frequency properties in order to enable high data rates. For this purpose, the optoelectronic components have hitherto been incorporated into TO housings having transparent windows. However, TO housings are relatively costly to manufacture and have a high structural height.

DE 199 35 496 C1 discloses an optoelectronic component and a method for producing it in which the optoelectronic component is arranged on an auxiliary carrier and a leadframe. The auxiliary carrier has a cutout in this case.

U.S. Pat. No. 6,014,476 discloses an electro-optical module in which an optoelectronic component is arranged on a carrier element which, at the side opposite to the optoelectronic component, has a lens worked into the carrier element.

SUMMARY OF THE INVENTION

The invention provides an optoelectronic module having at least one leadframe, at least one carrier element connected to the leadframe, and at least one optoelectronic component connected to the carrier element, which component can emit and/or receive light.

An optoelectronic module constructed in this way can be produced simply and cost-effectively since already known technologies for producing IC packages or modules are suitable for producing such an optoelectronic module. Furthermore, such an optoelectronic module can be introduced simply into printed circuit board layouts since the leadframe can be adapted in each case to standardized module or package sizes.

Leadframe is understood here to be a metallic and/or metalized frame on and/or in which electrically contact-connectable components, in particular also optoelectronic components, can be arranged and which is at least partly encapsulated with a plastic in order to produce a module or package that can be handled. In this case the leadframe has at least those connection lines which, after the production of the finished module or package, can be connected to a printed circuit board and, accordingly, are not encapsulated with plastic and/or project from the module or package.

The connection between the leadframe and the carrier element may be produced by means of an electrical connection, for example via bonding wires, or by means of a direct mechanical connection, for example by direct bearing of the carrier element on the leadframe.

In an advantageous manner, the carrier element is essentially transparent at least to the light emitted and/or received by the optoelectronic component, and the leadframe has, in the region of the carrier element, at least one opening for the passage of light emitted and/or received by the optoelectronic component. In this way, it is possible to provide an optoelectronic module which emits through the plane of the leadframe or receives through said plane.

A configuration of an optoelectronic module that can be handled simply can be achieved by the leadframe, the carrier element and the optoelectronic component being surrounded at least partly with a plastic.

In order to prevent scattered light from being able to pass out of the optoelectronic module or into the optoelectronic module, the plastic is essentially nontransparent at least to the light emitted and/or received by the optoelectronic component.

Simple integration of the module into customary printed circuit board layouts is achieved by the leadframe being tin-coated at least one surface and, together with the plastic, forms a surface-mountable component, in particular an SMD, TSSOP or a VQFN package. As a result of this, simple mounting of the optoelectronic module is possible and the module can be introduced into a printed circuit board layout for example by means of surface mounting and can be connected to the printed circuit board.

In an advantageous design of the invention, the carrier element is accommodated completely in the opening of the leadframe. In this embodiment, a surface of the carrier lies in the plane of a surface of the leadframe. In this case, it is possible for at least one region of the carrier element not to be surrounded with plastic, so that the carrier element is arranged in particular as an exposed die. What is achieved as a result of this is that the transparent carrier element terminates directly with the outer side of the optoelectronic module or the package. Light can therefore be coupled in relatively simply, in which case that region of the carrier element which is arranged as an exposed die can at the same time be kept free of contamination in a simple manner since a plane area is involved. Moreover, the heat of the optoelectronic component arranged in the interior of the module can be dissipated in a simple manner via that area of the carrier element which is arranged on the outer side of the module.

In this case, the carrier element preferably has semiconductor material and, in particular, is a semiconductor submount. Semiconductor material, in particular silicon, may be formed in such a way that it is transparent in wavelength ranges used in communication technology. A glass or sapphire substrate may also be used for other wavelengths.

In order to produce an optoelectronic module which is as far as possible complete and can be handled simply, preferably at least one further electronic component, in particular a passive and/or active component, is arranged within the extent of the leadframe. In this case, such a further electronic component may be arranged at the leadframe itself. In a preferred arrangement, the further electronic components may also be arranged in an opening of the leadframe, so that the further electronic component has at least one region which is not surrounded with plastic and in this way is arranged as an exposed die. In this preferred configuration, a surface of the carrier lies in the plane of a surface of the leadframe, in particular in the plane of the surfaces of the contact areas. In this way, the waste heat generated by the further component can be dissipated well since the area that is not surrounded by the plastic can be contact-connected for example directly to a thermally conductive plate.

In order to achieve simple entry of light into the optoelectronic module, in particular to the optoelectronic component, or from the optoelectronic component out of the optoelectronic module, the carrier element has at least one lens for focusing light which is emitted by the optoelectronic component and/or radiates onto the latter. In this case, said lens may be arranged in a manner recessed in the carrier element or be formed as a plane, diffractive lens.

The electrical contact-connection within the optoelectronic module is advantageously achieved by the carrier element and/or the optoelectronic component being electrically connected to the leadframe via at least one bonding wire. The connection of the optoelectronic component, in particular of an optoelectronic semiconductor chip, to the carrier element may also be effected by means of flip-chip mounting.

In order to obtain a transceiver that can be used in communication technology, the optoelectronic component is either a semiconductor laser chip or a semiconductor photodetector. The carrier element may furthermore likewise itself comprise an optoelectronic detector.

For simple coupling of an optical plug or an optical fiber to the optoelectronic module, in an advantageous manner, at least one receptacle for an optical plug or an optical fiber is arranged in the region of the opening of the leadframe and thus in the region of the beam direction of the optoelectronic component. For simple alignment of the receptacle relative to the leadframe, said receptacle advantageously has an alignment region which interacts with the opening of the leadframe. In order to further improve the coupling-in of the light, the receptacle may have an optical lens.

A simple contact-connection or a simple arrangement of the optoelectronic module in a printed circuit board environment may be achieved by the leadframe and/or the carrier element being arranged on an essentially flexible printed circuit board. Electrical connections are then advantageously provided at the flexible printed circuit board and are in electrical contact with the optoelectronic component. Said electrical connections may be formed as pins and/or as plugs.

A simple arrangement of the optoelectronic module in a housing may be achieved by the electrical connections being arranged in a region of the flexible printed circuit board which is arranged essentially perpendicular to the region at which the leadframe and/or the carrier element are arranged.

The printed circuit board advantageously likewise has an opening through which light can pass, in the region of the opening of the leadframe. By virtue of this arrangement of the optoelectronic module on a flexible printed circuit board, the optoelectronic module may be fitted for example on a rear side of a housing of a communication device, whereas the remaining printed circuit board regions, which carry further electronics, are arranged essentially parallel to the bottom of the housing.

In an advantageous development of the invention, the optoelectronic module has an electrical shielding. Since optoelectronic modules often work with very high frequencies in the region of approximately 10 GHz, such optoelectronic modules radiate microwave radiation, inter alia. An electrical shielding therefore prevents these microwaves from being able to emerge from the optoelectronic module.

In this case, the electrical shielding advantageously has a shielding plate. In order to achieve an efficient shielding, the optoelectronic module is advantageously completely surrounded by the electrical shielding. For this purpose, the leadframe and/or the carrier element may be arranged on a printed circuit board and an electrical shielding is arranged around the leadframe and/or the carrier element, at least part of the shielding being formed through the printed circuit board and the leadframe.

The invention furthermore provides a method for producing an optoelectronic module, having the steps of:
providing at least one leadframe, at least one carrier element and at least one optoelectronic component,
connecting the optoelectronic component to the carrier element and connecting the carrier element to the leadframe, and
at least partly encapsulating the optoelectronic component, the carrier element and the leadframe with a plastic.

This method makes it possible to produce the optoelectronic module at manufacturing sites for already known IC packages.

The carrier element is advantageously arranged in the opening of the leadframe. This makes it possible to form the carrier element as an exposed die.

In an advantageous development of the invention, wherein the leadframe is arranged on a film prior to the encapsulation with the plastic and said film is at least partly removed again after the encapsulation. This makes it possible for specific regions of the carrier element and/or of the leadframe to be completely protected from contamination due to the plastic used for the encapsulation or due to the soldering. In an advantageous development of the method, the film remains at least in the region of the opening of the leadframe until the leadframe is connected to a printed circuit board. This ensures that the opening in the leadframe, which in some embodiments forms a type of blind hole is not contaminated and the optoelectronic component can thus radiate through the carrier element reliably through the opening in the leadframe.

BRIEF DESCRIPTION OF THE DRAWINGS

The invention is explained in more detail below with reference to the figures of the drawings, in which.

DETAILED DESCRIPTION OF THE INVENTION

In the following detailed description of the figures, the same reference numerals are used for identical structural parts even though a plurality of different embodiments are involved.

Figure 1:
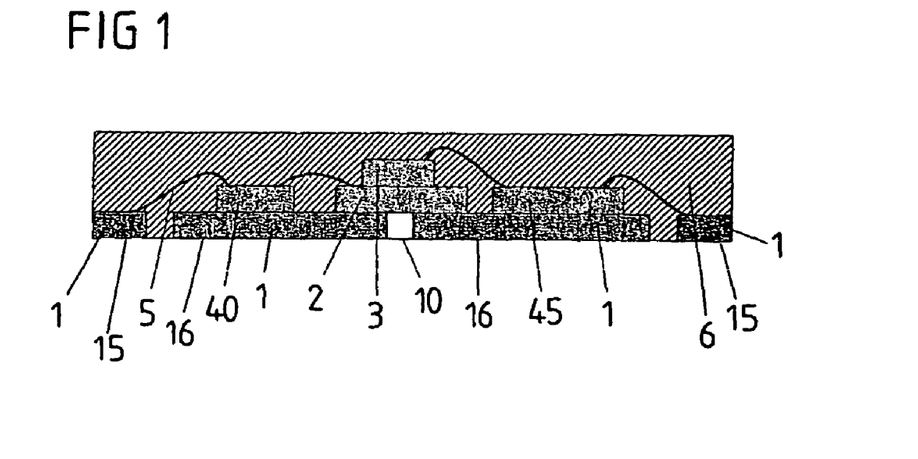
FIG. 1 shows a sectional illustration of an optoelectronic module in which a carrier element is arranged above an opening of the leadframe.

FIG. 1 shows a sectional illustration of an optoelectronic module. A leadframe 1 essentially forms the underside of the optoelectronic module. For this purpose, the leadframe 1 has contact areas 15 in the respective outer region of the optoelectronic module at the underside thereof, said contact areas being tin-coated. These tin-coated contact areas 15 serve for the mounting and electrical contact-connection of the optoelectronic module on a printed circuit board (not illustrated here). The optoelectronic module can thus be fitted on a printed circuit board for example by means of surface mounting.

The leadframe furthermore has surfaces 16 arranged in the inner region of the optoelectronic module on the underside thereof, which surfaces may likewise be connected to a printed circuit board and serve, inter alia, for dissipating heat from the interior of the optoelectronic module. The leadframe 1 furthermore has an opening 10, which, in the embodiment shown, is arranged in the center of the leadframe 1, and is formed for the passage of light.

A carrier element 2 is arranged on the leadframe 1 and an optoelectronic component 3, which may be formed for example as a semiconductor laser chip or a semiconductor detector chip, is arranged on said carrier element 2. In this case, the carrier element 2 is essentially transparent to the light emitted and/or received by the optoelectronic component 3. The optoelectronic component 3 and the carrier element 2 are arranged above the opening 10 of the leadframe 1 in such a way that light can fall onto the optoelectronic component 3 or pass from the optoelectronic component 3 through the opening 10. In this case, the optoelectronic component 3 and the carrier element 2 are arranged in the inner region of the leadframe, that is to say within the extent thereof, in particular the areal extent thereof.

Further electronic components, namely a passive component 40 and an active component 45, are arranged on the leadframe 1. If the optoelectronic component 3 is a semiconductor laser chip, the active component 45 may correspondingly be a laser driver, for example.

The individual components and in particular the carrier element 2 and the optoelectronic component 3 are connected to the leadframe 1 via bonding wires 5. Therefore, the electrical contact-connection of the optoelectronic component 3 takes place via the tin-coated contact surfaces 15 of the leadframe 1, then via the bonding wires 5 and the respective electronic components 40, 45 and then via further bonding wires 5. The connection of the optoelectronic component to the carrier element 2 may also be effected by means of flip-chip mounting.

The leadframe 1, the carrier element 2 and the optoelectronic component 3 are at least partly surrounded with a plastic 6. In this case, the plastic forms the actual outer form of the module housing or the package, so that the optoelectronic module shown in FIG. 1 essentially forms a VQFN (very thin profile quad flat non leaded package), that is to say a package without contact legs. The plastic may be formed as a nontransparent plastic, so that the optoelectronic component 3 is optically shielded.

Figure 2:
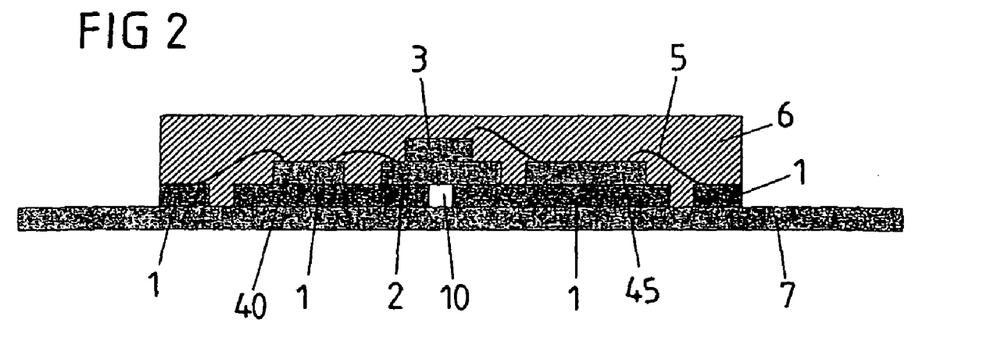
FIG. 2 shows a sectional illustration of the optoelectronic module of FIG. 1 during production in a method step in which the leadframe is arranged on a film.

FIG. 2 shows the optoelectronic module of FIG. 1 in an end phase of the production process. For production, the leadframe 1 was arranged on a film 7 and the carrier element 2 and the optoelectronic component 3 were arranged in the region of an opening 10 of the leadframe 1. Further electronic components 40, 45 were arranged on the leadframe and an electrical contact-connection at least of the optoelectronic component 3 was performed via bonding wires 5. The arrangement was thereupon encapsulated or molded with plastic 6 or a mold, thus producing the desired housing form.

Figure 3:
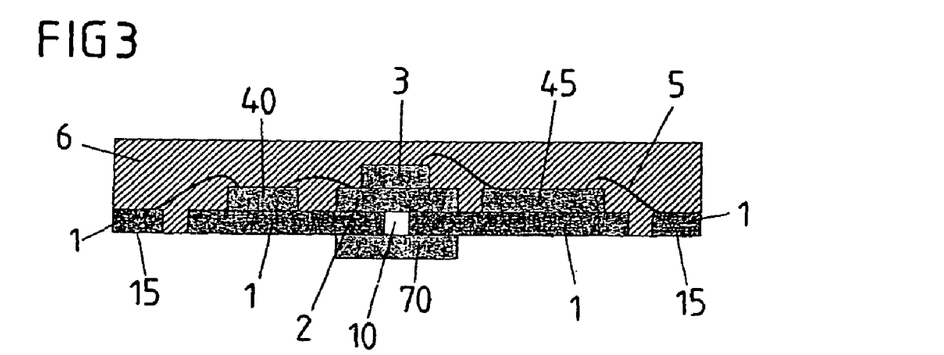
FIG. 3 shows a sectional illustration through the optoelectronic module of FIG. 2 in a further method step, in which the film is essentially removed and remains only in the region of the opening of the leadframe.

After the application of the plastic, the film 7, which first of all protects the undersides of the respective components from contamination during production, and also serves as a boundary for the plastic, is then removed in almost all regions, as shown for example in FIG. 3.

A piece of plastic film 70 remains only in the region of the opening 10 of the leadframe 1, and protects the opening 10. This prevents contamination of the opening 10—essentially in the form of a blind hole—in the leadframe, through which opening the light is intended to pass from the optoelectronic component 3 or to the optoelectronic component 3. After the final mounting of the optoelectronic module or after the soldering thereof, this piece of film 70 can also be stripped away, thereby freeing the opening 10.

Figure 4:
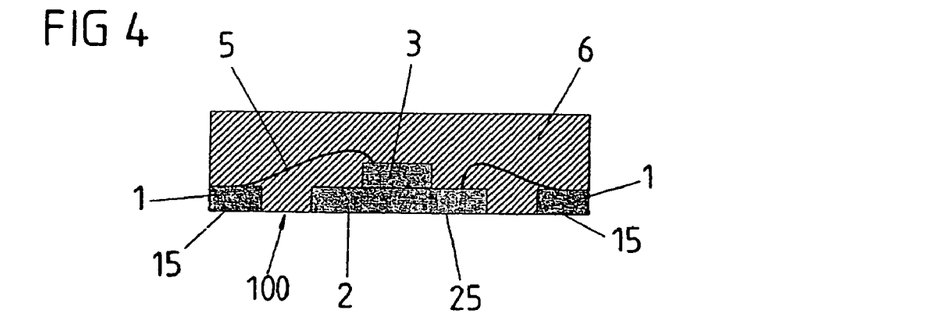
FIG. 4 shows an illustration through an optoelectronic module in a further embodiment, in which the carrier element is formed as an exposed die.

FIG. 4 shows an optoelectronic module in a further embodiment. Provision is likewise made here of a leadframe 1 having contact areas 15 at its underside, said contact areas being tin-coated. An opening 100 is again provided within the extent of the leadframe 1, but this time said opening is made large enough that the carrier element 2 can be completely accommodated in the opening. Therefore, the underside of the carrier element 25 lies in the same plane as the contact areas 15 of the leadframe 1. An optoelectronic component 3 is arranged on the carrier element 2, and can emit or receive light through the carrier element 2.

The optoelectronic component 3 and the carrier element 2 are again connected via bonding wires 5 to the leadframe 1 and thus to the contact areas 15. A plastic 6 at least partly surrounds the leadframe, the carrier element 2 and the optoelectronic component 3, in order to form the housing form actually desired and in order also to fix the carrier 2 relative to the leadframe 1.

The underside 25 of the carrier 2 is formed in a plane manner here, so that the problem of contamination of the opening 10 through which light passes, which problem exists in the embodiment shown in FIGS. 1 to 3, cannot occur. Rather, the plane surface 25 of FIG. 4 enables simple removal of dirt from this surface. The carrier 2 is formed as an exposed die here. Heat which arises in the optoelectronic component 3 can be dissipated simply here since the heat passes from the interior of the optoelectronic module through the carrier element 2 directly to the surface of the optoelectronic module.

In the embodiment shown in FIG. 4, the surface (25) of the underside of the carrier element (2) lies in one plane with the contact surfaces 15 of the leadframe 1.

Figure 5:
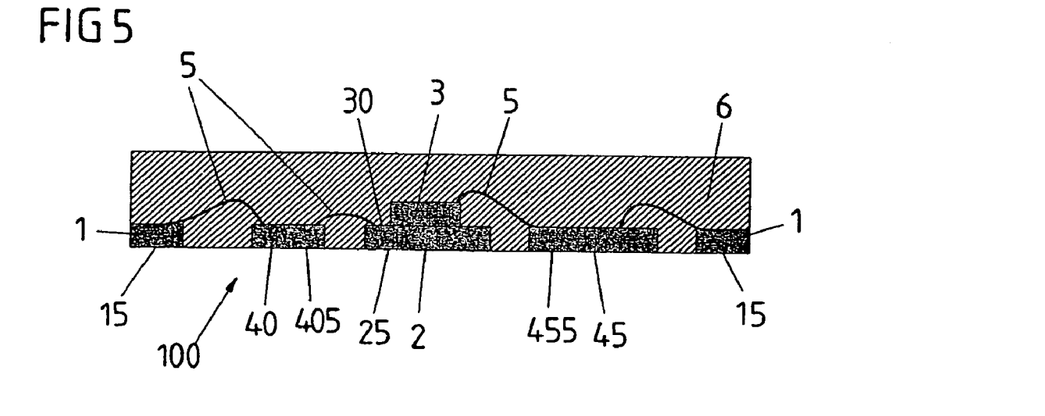
FIG. 5 shows a sectional illustration through a further optoelectronic module, in which further electronic components are provided, which are arranged as an exposed die.

FIG. 5 shows a variant of the exemplary embodiment shown in FIG. 4. Here, in addition to the carrier element 2, further electrical components 40, 45 are arranged directly on the underside of the optoelectronic module, so that their surfaces 405 and 455, respectively, lie in one plane together with the underside 25 of the carrier element 2 and the contact areas 15 of the leadframe 1 and are accordingly likewise formed as an exposed die. In this way, the further electrical components 40, 45 can likewise afford good dissipation of the heat that arises. The plastic 6 once again fixes the individual components with respect to one another.

In the embodiment shown in FIG. 5, the carrier element 2 additionally has an optoelectronic detector integrated in the carrier element. Therefore, the carrier element 2 is only formed in semitransparent fashion and the optoelectronic component 3 is formed as a semiconductor laser. In this way, a transceiver is produced which can both transmit via the semiconductor laser 3 and receive via the optoelectronic detector 30.

Figure 6:
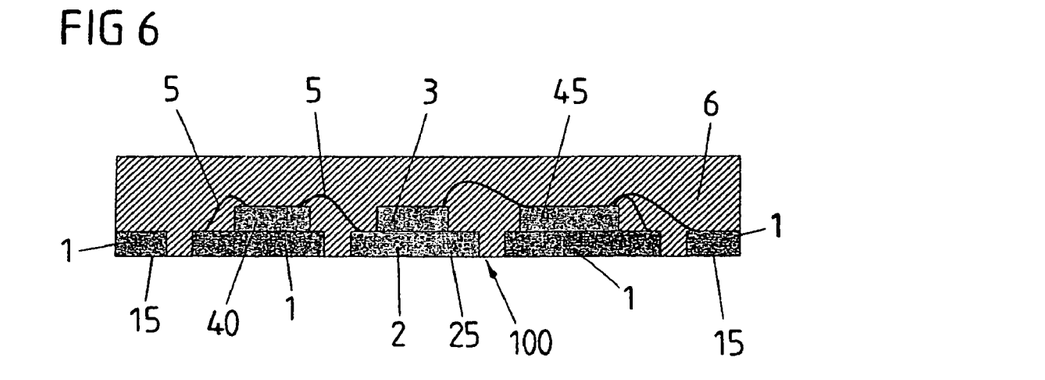
FIG. 6 shows a sectional illustration through an optoelectronic module in a further embodiment, in which the carrier as an exposed die and further electronic components are arranged on the leadframe.

FIG. 6 shows a further configuration of the different exemplary embodiments shown in FIGS. 4 and 5, respectively. In the embodiment shown in FIG. 6, the further electronic components 40, 45 are arranged in direct contact with the leadframe 1. However, the carrier element 2 with the optoelectronic component 3 is again arranged in an opening 100 of the leadframe 1 in such a way that the underside 25 of the carrier element 2 lies in one plane with the contact areas 15 of the leadframe 1 and accordingly forms an exposed die. Here, too, the plastic 6 again serves, inter alia, for fixing the individual components relative to one another. The heat dissipation of the further components 40, 45 is effected here via the leadframe 1.

Figure 7:
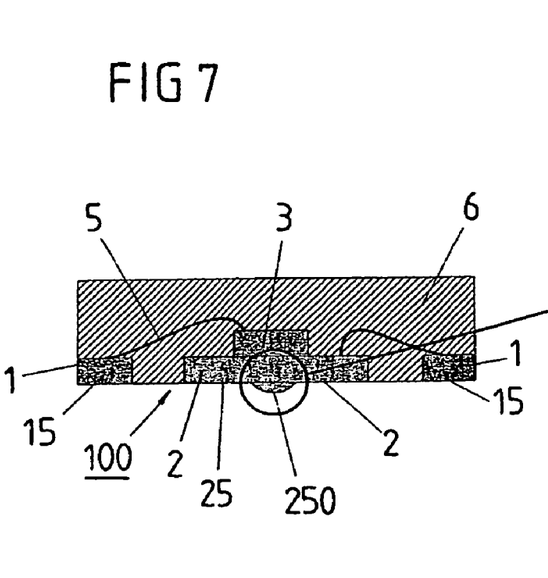
FIG. 7 shows a sectional illustration through a further embodiment of an optoelectronic module, a lens being arranged at the carrier.
Figure 7A:
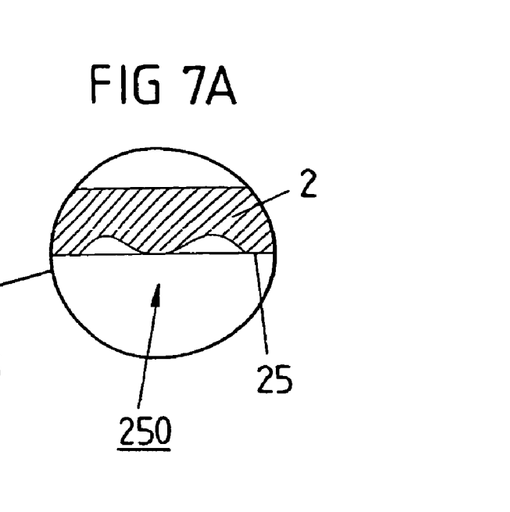
FIG. 7a shows a detail view of the lens shown in FIG. 7.

FIG. 7 shows a variant of the embodiment shown in FIG. 4. In this case, the carrier element 2 has a lens 250 arranged at the underside 25 of the carrier element 2. As shown in the detail illustration in FIG. 7A, the lens 250 is recessed in the surface 25 of the carrier element 2. What is achieved as a result of this is that, first of all, no components project beyond the plane formed by the contact areas 15 of the leadframe 1 and, secondly, the lens 250 brings about an improvement in the light coupling of the optoelectronic module.

Figure 8:
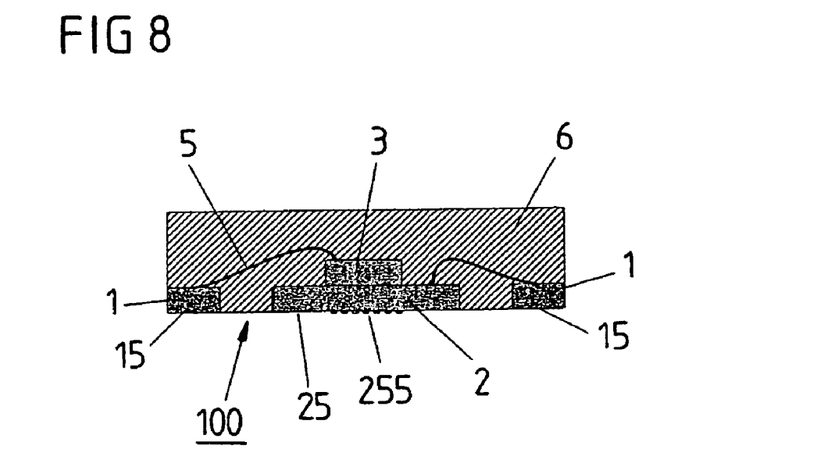
FIG. 8 shows a sectional illustration through an optoelectronic module in a further embodiment, in which a plane, diffractive lens is arranged at the carrier.

FIG. 8 shows a variant of the arrangement shown in FIG. 7. Here, a diffractive lens 255 is depicted symbolically on the underside 25 of the carrier element 2. Said diffractive lens 255 may be formed in completely plane fashion, so that here, too, no parts protrude beyond the plane formed by the contact surfaces 15.

Figure 9:
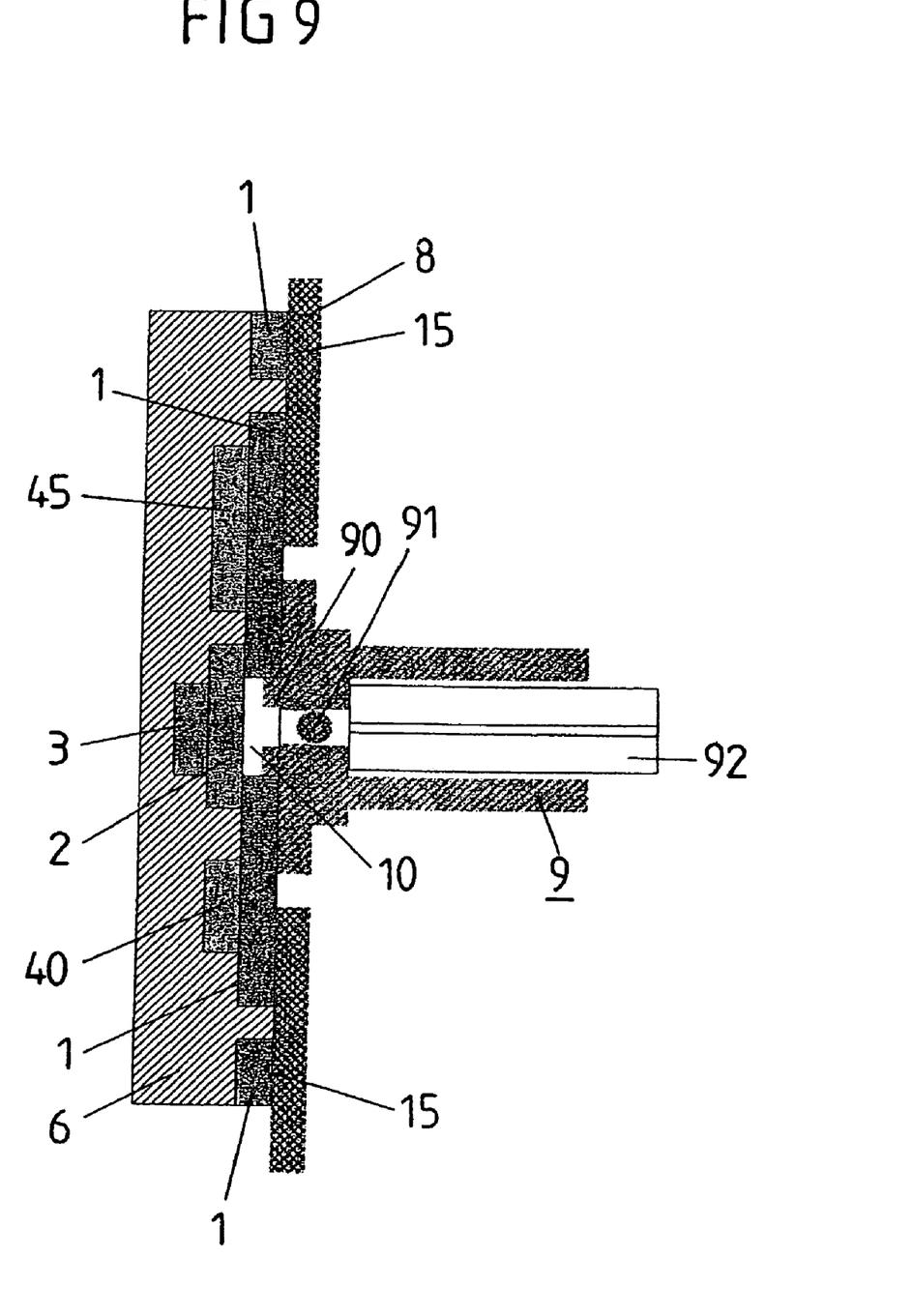
FIG. 9 shows a sectional illustration through an arrangement comprising an optoelectronic module, a printed circuit board and a receptacle for an optical fiber.

FIG. 9 shows an arrangement of the optoelectronic module having a leadframe 1, a carrier element 2 and an optoelectronic component 3 and also further electrical components 40, 45, which are at least partly surrounded by a plastic 6. A receptacle 9 serving to receive an optical fiber 92 or an optical plug is provided at the opening 10 of the leadframe. In this case, alignment regions 90 of the receptacle 9 engage in the opening 10 of the leadframe 1 in such a way that the receptacle 9 is aligned relative to the leadframe 1; in this case, the receptacle 9 is as it were plugged into the opening 10 of the leadframe 1. This makes it possible to achieve simple orientation of an optical fiber 92 to the optoelectronic component 3. In this case, a lens 91 arranged in the receptacle 9 improves the coupling of light into and out of the optoelectronic component 3.

In the embodiment shown in FIG. 9, the optoelectronic module is arranged on a printed circuit board 8, the contact areas 15 of the leadframe 1 being soldered to the printed circuit board 8.

Figure 10:
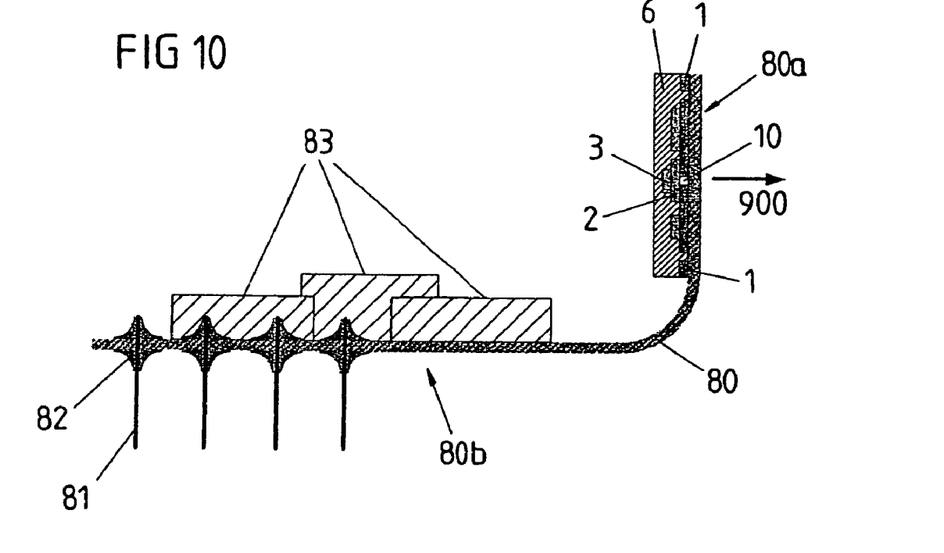
FIG. 10 shows a sectional illustration through an arrangement comprising an optoelectronic module, a flexible printed circuit board and electrical connections in the form of pins.

FIG. 10 shows an arrangement of the optoelectronic module on a flexible printed circuit board 80, the printed circuit board 80 having a 90° angle. In this case, the optoelectronic module is arranged in a first region 80a of the printed circuit board 80 and a plurality of pins 81 are soldered, by means of a solder 82, in a region 80b arranged at right angles to said region 80a. In this case, the pins 81 serve for contact-connection of the printed circuit board 80.

Furthermore, the illustration diagrammatically shows electrical components 83 which are likewise arranged on the electrical printed circuit board 80. Such an arrangement may be arranged for example within a housing, so that, for example, an optical fiber can be coupled to the optoelectronic module in the direction of the arrow 900 and, on the other hand, it is possible to form the electrical contact-connection via the pins 81 with a printed circuit board arranged within the housing.

Figure 11:
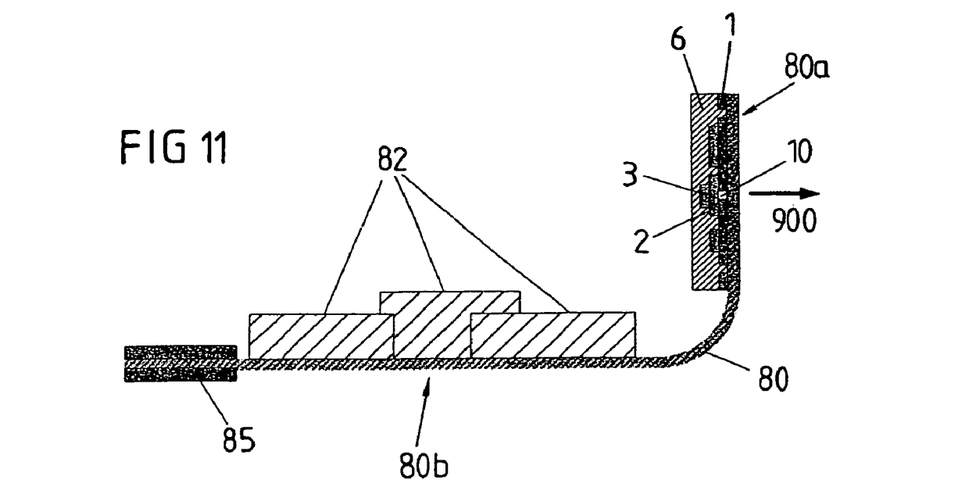
FIG. 11 shows a sectional illustration through an arrangement comprising an optoelectronic module, a flexible printed circuit board and an electrical plug.

FIG. 11 shows a further arrangement for contact-connection of the optoelectronic module, the optoelectronic module again being arranged on a flexible printed circuit board 80 similar to that shown in FIG. 10. In contrast to the embodiment shown in FIG. 10, however, here use is made of an electrical plug 85 for contact-connection of the printed circuit board 80.

Figure 12:
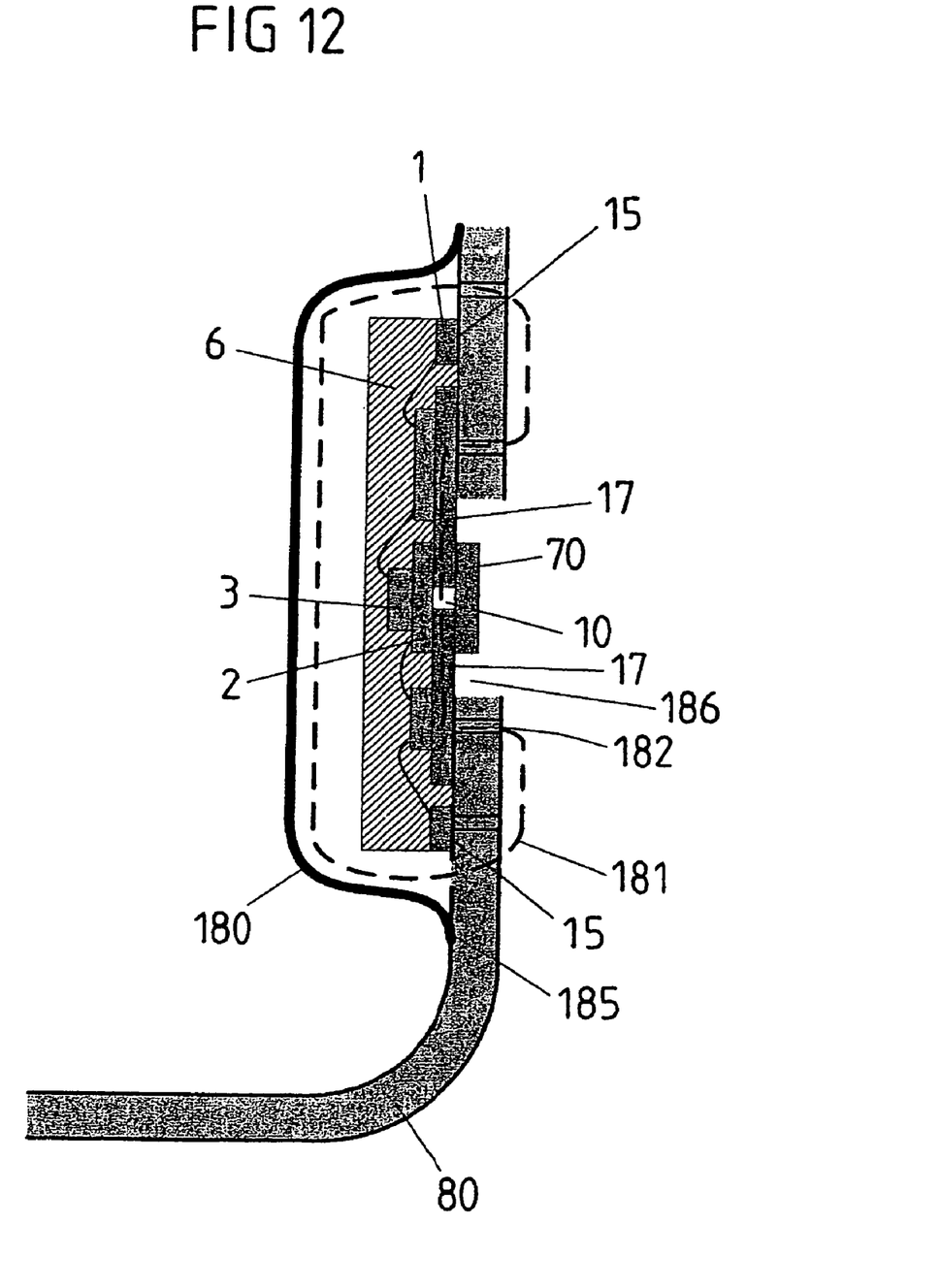
FIG. 12 shows a sectional illustration through an arrangement comprising an optoelectronic module, a flexible printed circuit board and an electrical shielding.

FIG. 12 shows a further variant of an arrangement of an optoelectronic module on a flexible printed circuit board 80. In this case, the optoelectronic module is arranged in such a way that the opening 10 of the leadframe is arranged in the region of an opening 186 of the flexible printed circuit board 80. In this case, the optoelectronic module is soldered to the printed circuit board 80 in the region of the contact surfaces 15 of the leadframe 1 with the printed circuit board 80. During soldering, for example by means of flip-chip mounting, a shielding plate 180, which spans the optoelectronic module, can at the same time be concomitantly soldered on the printed circuit board 80 in the soldering region 185.

A continuous shielding 181 is illustrated by broken lines. This shielding 181 completely surrounds the optoelectronic module. For this purpose, plated-through holes 182 are provided in the flexible printed circuit board 80, through which the electrical shielding can be completely closed. In this case, the leadframe 1 and the printed circuit board 80 form at least part of the shielding 181.

In concrete terms, the shielding shown by 181 is embodied such that one side of the optoelectronic module is shielded by means of the shielding plate 180, and the underside is essentially shielded by the inner region of the leadframe 17. In this case, an electrical connection between the shielding plate 180 and the inner region 17 of the leadframe is achieved by conductor tracks (not shown here) and the plated-through hole 182 shown. This results in a shielding region which is completely closed around the optoelectronic module.

FIG. 12 also reveals part of the film 70, which is arranged above the opening 10 of the leadframe 1. This film 70 is removed at the latest as soon as the optoelectronic module is put into operation or before a receptacle for an optical fiber or an optical plug is mounted on the module.

The invention claimed is:

1. An optoelectronic module, comprising:
   a leadframe having a top surface and a bottom surface with an aperture extending from the top surface to the bottom surface and electrical contact areas on the bottom surface;
   a carrier element having a substantially transparent body with a top surface and a bottom surface and having its bottom surface being located on the top surface of the leadframe and covering the aperture; and
   an optoelectronic component having a top surface and a light emitting and/or receiving bottom surface and having its bottom surface being located on the top surface of the carrier element so as to be oriented over the aperture of the leadframe, wherein the optoelectronic component is electrically connected to the leadframe and is oriented to emit and/or receive light through the body of the carrier element and through the aperture of the leadframe,
   wherein the leadframe, the carrier element and the optoelectronic component are surrounded at least partly with a plastic, and wherein the body of the carrier element comprises a material that is substantially transparent at least with respect to the light emitted and/or received by the optoelectronic component.

2. The optoelectronic module as claimed in claim 1, wherein the plastic comprises a substantially nontransparent material at least with respect to the light emitted and/or received by the optoelectronic component.

3. The optoelectronic module as claimed in claim 1, wherein the electrical contact areas of the leadframe are tin-coated at least one surface and, together with the plastic, forms a surface-mountable component.

4. The optoelectronic module as claimed in claim 1, wherein at least one surface of the carrier element is arranged in a plane of a surface of the leadframe.

5. The optoelectronic module as claimed in claim 1, wherein at least one surface of the carrier element is arranged in a plane of a surface of the leadframe, and wherein the at least one region of the carrier element is not surrounded with plastic, wherein the carrier element is arranged as an exposed die at the surface thereof.

6. The optoelectronic module as claimed in claim 5, wherein the region of the carrier element which is not surrounded with plastic is configured to facilitate light entry and/or exit to and/or from the module, respectively.

7. The optoelectronic module as claimed in claim 1, wherein the carrier element comprises semiconductor material.

8. The optoelectronic module as claimed in claim 1, further comprising at least one further electronic component connected to the leadframe.

9. The optoelectronic module as claimed in claim 8, wherein at least one surface of the further electronic component is arranged in a plane of a surface of the leadframe.

10. The optoelectronic module as claimed in claim 8, wherein the at least one further electronic component comprises at least one region which is not surrounded with plastic, wherein the at least one further electronic component is arranged as an exposed die.

11. The optoelectronic module as claimed in claim 1, wherein the carrier element comprises at least one lens configured to focus light which is emitted by the optoelectronic component and/or radiates onto the optoelectronic component.

12. The optoelectronic module as claimed in claim 11, wherein the lens is arranged in a recessed portion in the carrier element.

13. The optoelectronic module as claimed in claim 11, wherein the lens comprises a plane, diffractive lens.

14. The optoelectronic module as claimed in claim 1, wherein the carrier element and/or the optoelectronic component are electrically connected to the leadframe via at least one bonding wire.

15. The optoelectronic module as claimed in claim 1, wherein the optoelectronic component comprises a semiconductor laser chip and/or a semiconductor photodetector.

16. The optoelectronic module as claimed in claim 1, wherein the carrier element comprises an optoelectronic detector.

17. The optoelectronic module as claimed in claim 1, further comprising at least one receptacle for an optical plug or an optical fiber arranged in the region of the opening of the leadframe.

18. The optoelectronic module as claimed in claim 17, wherein the receptacle comprises an alignment region, which interacts with the opening of the leadframe to align the receptacle relative to the leadframe.

19. The optoelectronic module as claimed in claim 18, wherein the receptacle comprises an optical lens.

20. The optoelectronic module as claimed in claim 1, wherein the leadframe and/or the carrier element are arranged on a substantially flexible printed circuit board.

21. The optoelectronic module as claimed in claim 20, further comprising electrical connections associated with the flexible printed circuit board in electrical contact with the optoelectronic component.

22. The optoelectronic module as claimed in claim 21, wherein the electrical connections comprise pins or plugs.

23. The optoelectronic module as claimed in claim 21, wherein the electrical connections are arranged in a first region of the flexible printed circuit board which is arranged essentially perpendicular to a second region thereof at which the leadframe and/or the carrier element are arranged.

24. The optoelectronic module as claimed in claim 20, wherein the printed circuit board comprises an opening through which light can pass.

25. The optoelectronic module as claimed in claim 1, further comprising an electrical shielding overlying a portion of the at least one optoelectronic component.

26. The optoelectronic module as claimed in claim 25, wherein the electrical shielding comprises a shielding plate.

27. The optoelectronic module as clamed in claim 25, wherein the leadframe, carrier element, and optoelectronic component of the optoelectronic module are substantially completely surrounded by the electrical shielding.

28. The optoelectronic module as claimed in claim 25, wherein the leadframe and/or the carrier element are arranged on a printed circuit board and an electrical shielding is arranged around the leadframe and/or the carrier element, a portion of the shielding passing through the printed circuit board.

29. The optoelectronic module as claimed in claim 1, wherein the plastic fixes a position of the carrier relative to the leadframe.

30. The optoelectronic module as claimed in claim 1, wherein the optoelectronic component is flip-chip mounted to the carrier element.

31. An optoelectronic module, comprising:
a leadframe having a top surface and a bottom surface with an aperture extending from the top surface to the bottom surface and electrical contact areas on the bottom surface;
a carrier element having a body with a top surface and a bottom surface located on the top surface of the lead frame and covering the aperture; and
an optoelectronic component having a top surface and a light emitting and/or receiving bottom surface bottom surface located on the top surface of the carrier element so as to be oriented over the aperture of the leadframe, wherein the optoelectronic component is electrically connected to the leadframe and arranged on the carrier element such that the carrier element is positioned between the leadframe and the optoelectronic component,
wherein the optoelectronic component is oriented to emit and/or receive light through the aperture of the lead frame and the body of the carrier element, and where the carrier element is substantially transparent at least to the light emitted and/or received by the optoelectronic component.

32. The optoelectronic module as claimed in claim 31, further comprising a film covering the aperture in the lead frame so as to prevent contamination of the opening prior to operational use of the optoelectronic module.

33. The optoelectronic module as claimed in claim 31, wherein the aperture in the leadframe is sized and configured to receive a correspondingly sized optical fiber receptacle, and wherein the aperture is positioned to optically align an optical fiber received by the optical fiber receptacle with the optoelectronic component.

* * * * *